United States Patent [19]

Adwalpalker et al.

[11] Patent Number: 4,504,322

[45] Date of Patent: Mar. 12, 1985

[54] RE-WORK METHOD FOR REMOVING EXTRANEOUS METAL FROM CERMIC SUBSTRATES

[75] Inventors: Avinash S. Adwalpalker, Stormville; Ananda H. Kumar, Wappingers Falls; Renee L. Weisman, Poughkeepsie, all of N.Y.

[73] Assignee: International Business Machines Corporation, Armonk, N.Y.

[21] Appl. No.: 435,572

[22] Filed: Oct. 20, 1982

[51] Int. Cl.$^3$ ............................................. B08B 7/00
[52] U.S. Cl. ..................................... 134/1; 29/840; 29/885; 228/125
[58] Field of Search ............... 134/1, 17; 156/73.1, 156/73.6; 29/575, 839, 840, 885; 228/191, 125, 264; 427/57, 271, 383.9, 383.5

[56] References Cited

U.S. PATENT DOCUMENTS

| | | | |
|---|---|---|---|
| 3,420,758 | 1/1969 | Scheer | 204/105 |
| 3,554,793 | 1/1971 | Krieger | 427/271 |
| 3,698,408 | 10/1972 | Jacke | 134/122 |
| 3,698,941 | 10/1972 | De Nobel et al. | 117/212 |
| 3,898,351 | 8/1975 | Kennison et al. | 427/57 |
| 4,082,908 | 4/1978 | Vanaglash, Jr. | 427/383.9 |

FOREIGN PATENT DOCUMENTS 789293  1/1958  United Kingdom .................... 134/1

OTHER PUBLICATIONS

IBM TDB, vol. 11, No. 10, Mar. 1969, p. 1356.
IBM TDB, vol. 17, No. 5, Oct. 1974, p. 1310; No. 7, Dec. 1974, p. 2118.

Primary Examiner—William Smith
Assistant Examiner—Michael K. Boyer
Attorney, Agent, or Firm—Wolmar J. Stoffel

[57] ABSTRACT

A re-work method for removing extraneous plated metal layer areas from the surface of a ceramic substrate containing refractory metal areas wherein the substrate is heated at a temperature for a time sufficient to strengthen the bond between the plated metal layer and the refractory metal areas while simultaneously reducing the strength of the bond between the extraneous plated metal layer overlying the ceramic and the ceramic, immersing the substrate in a liquid, and applying localized ultrasonic energy in close proximity to the extraneous metal areas to be removed.

11 Claims, 9 Drawing Figures

RE-WORK METHOD FOR REMOVING EXTRANEOUS METAL FROM CERMIC SUBSTRATES

TECHNICAL FIELD

This invention relates to a method for repairing metallurgy, more particularly to a method for the removal of extraneous, plated metal areas on a ceramic substrate.

BACKGROUND ART

In the fabrication of multi-layer ceramic substrates for use in semiconductor packages of the type described in U.S. Pat. No. 4,245,273, a mixture of ceramic particles, a resin binder, and a solvent for the binder is doctor bladed into thin sheets and then dried. The resultant green ceramic sheets are punched to form via holes, the via holes filled and circuit patterns imprinted with a conductive paste, the sheets assembled into a laminated structure and the resultant substrate sintered to burn away the binder and solvent and fuse the ceramic particles. After the sintering operation, metallurgy patterns are formed on the top and bottom surface to make contact with and support suitable I/O connections. These connections are used to make electrical connections to semiconductor devices, normally on the top surface, and connections to a supporting board, card, or other support on the bottom surface. The internal metal of the substrate must withstand the high temperature sintering operation. This normally requires the use of a refractory metal. However, these metals cannot be conveniently joined to I/O and device elements by solder and brazing techniques. What is commonly done is depositing additional metallurgy patterns of metals that are solderable and compatible with brazing operations over the refractory metal vias and patterns.

However, during the sintering operation, green ceramic substrate shrinks substantially, usually on the order of 15 to 20%. Unfortunately, the shrinkage is not always uniform resulting in a distorted pattern of refractory metal vias and other patterns on the sintered substrate surface. When the geometry of the refractory metal pattern is small, as it must be in high performance semiconductor substrates, and the substrate is of substantial size, the subsequent metallurgy pattern cannot be deposited by conventional evaporation through a mask or blanket evaporation followed by subtractive etching because it requires alignment of a mask with the underlying refractory metallurgy pattern. The distortion occurring during sintering thus precludes mask alignment to the pattern.

In order to apply the necessary non-refractory metal layers over the refractory metal areas on a substrate, the metals must be deposited by electroless and immersion plating or by electroplating techniques. Electroplating has not been generally used because this type of deposition requires establishing electrical contact to the specific areas to be plated in order to make them the cathode. Making this electrical contact is not always possible because some of the pad areas may be electrically floating. Electroless plating is a form of chemical plating which involves reduction of a metal salt to the metal with the simultaneous oxidation of a chemical compound called a reducing agent. To prevent or at least minimize the tendency for the oxidation-reduction reaction to take place throughout the plating solution, electroless plating solutions are formulated so that the concentration of the metal salt and/or reducing agent and Ph are such that the metal reduction does not occur readily. This being so, the areas to be plated would not be plated either. This problem is overcome by the use of catalysts which localize the plating reaction to the desired surfaces only. In the case of the ceramic substrates, the refractory metal surface areas are catalyzed to promote the oxidation-reduction reaction, whereas the ceramic material areas are not. The metal is thus selectively deposited only on and over the refractory metal areas.

During the electroless plating operation, there frequently occurs extraneous metal deposition that does not overlie the refractory metal areas. This extraneous plating is unacceptable since electrical shorting will occur between metal pads that must be electrically isolated. In order to remove these extraneous metal areas of non-refractory metal, the entire metallurgy layer over the refractory metal is removed and the electroless deposition process repeated. This rework is time-consuming and quite expensive since a plurality of non-refractory metals are normally deposited over the refractory metal. Also, it has been found that the number of times that the rework operation can be repeated is low, sometimes only one time, before the entire substrate is degraded to the point that it must be discarded. At this point in time, the multi-layer ceramic substrate is nearly complete and represents a relatively large investment.

What is needed in the packaging industry is a simple and inexpensive process for selectively removing extraneous metal that does not overlie the refractory metal layer area. The rework process must not degrade the substrate or the refractory metal areas and must not involve use of masking for the reasons previously discussed.

The prior art, U.S. Pat. No. 3,698,941, discloses a method of applying contacts to a semiconductor body wherein the semiconductor surface, in which the surface is partly covered by an insulating layer, has deposited a metal layer applied to the entire surface. The metal layer is heated to increase the adherence of the metal layer to the semiconductor material and is subsequently subjected to acoustic high-frequency vibrations to remove the metal layer on portions overlying the insulating layer.

DISCLOSURE OF THE INVENTION

In accordance with the present invention, we provide a re-work process for selective removal of extraneous metal areas from the surface of the ceramic substrate containing refractory metallurgy areas in which the substrate is heated to a temperature sufficient to strengthen the bond between the refractory metal areas and the overlying metal while reducing the strength of the bond between the ceramic and metal, immersing the substrate in a liquid, and applying localized ultrasonic energy in close proximity to the metal areas to be removed.

BEST MODE FOR CARRYING OUT THE INVENTION

Ceramic substrates used for packaging semiconductor devices, more particularly, multi-layer ceramic substrates, utilize electro, electroless and immersion metal plating on screened refractory features to complete the top and bottom surface metallurgy patterns. As a result of such factors as improper rinsing, plating bath hyperactivity, excessive handling, and fused ceramic repairs, undesirable extraneous metal can be deposited on the ceramic surface. Should this material grow so large as to bridge between features or to violate spacing requirements, the substrate must be rejected. One such defect between two features is sufficient to reject a substrate containing over 20,000 features. When a bridge is detected, the substrate must be reworked, that is, the metal overlying the refractory metal removed and replaced. More specifically, the rework process involves stripping off the entire deposited metallurgy layer, commonly nickel and gold, and replating. The replating process requires many steps taking up to 30 hours of time.

The process of our invention utilizing ultrasonics provides an effective and economical way of removing the metal deposited on the ceramic. The process includes two essential steps. First, the metal film overlying the refractory metal must be subjected to a heat treatment which strengthens the refractory-metal adhesion, typically nickel to molybdenum, while weakening the metal-to-ceramic bond. This is achieved through diffusion at a temperature in excess of 600° C., depending on the metals preferably in a hydrogen atmosphere. Secondly, the substrate is placed in a liquid, for example water, and an ultrasonic horn is positioned to direct its energy to the poorly adhering film on the ceramic until it is lifted off.

Figure 1:
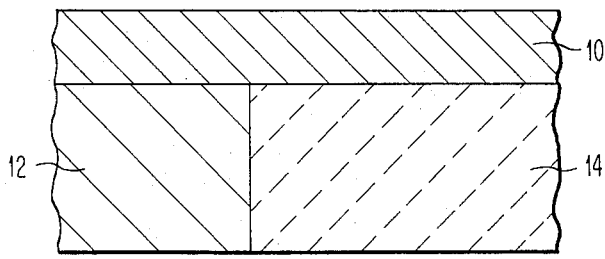
FIGS. 1, 2 and 3 depict a cross-section of a substrate and overlying metal film in greatly exaggerated vertical dimensions illustrating the various stages of practice of the rework process of our invention.
Figure 2:
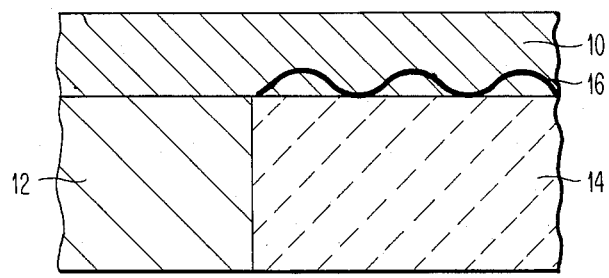
Figure 3:
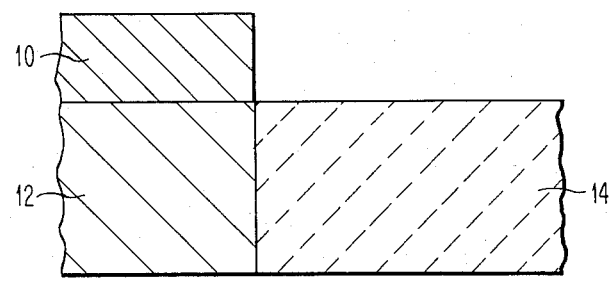

Referring now to FIGS. 1-3 of the drawings, FIG. 1 illustrates the metal film 10, as for example a nickel layer, applied by electroless deposition overlying a refractory metal via 12 and the top surface of the ceramic substrate 14. The refractory metal areas can be screened paste areas that are deposited on the top surface of a ceramic surface. The area of metal film 10 overlying and in contact with the surface of ceramic substrate 14 is extraneous metal which will be removed by the process of the invention. In FIG. 2 there is depicted the interface condition of the substrate indicated by wavy line 16. The metal film 10 overlying ceramic substrate 14 has been loosened by the heat treatment previously described. Although not indicated on the drawing, the bond between the film 10 and the refractory metal via 12 has been strengthened significantly. FIG. 3 depicts the condition of the substrate following the application of ultrasonic energy in a liquid environment. Note that the portion of metal film 10 overlying ceramic substrate 14 has been completely removed.

Figure 4:
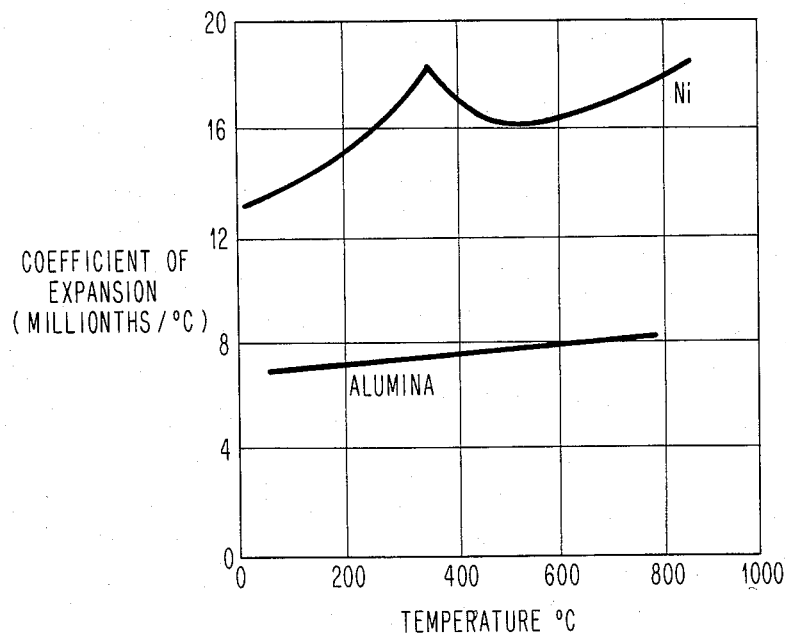
FIG. 4 is a plot of the coefficient of expansion versus the temperature for alumina and nickel.
Figure 5:
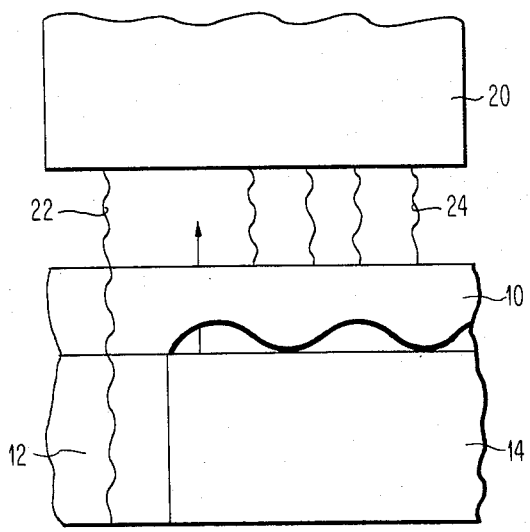
FIG. 5 is a cross-section of a substrate illustrating the effect of the application of ultrasonic energy to a nickel film on a substrate.
Figure 6:
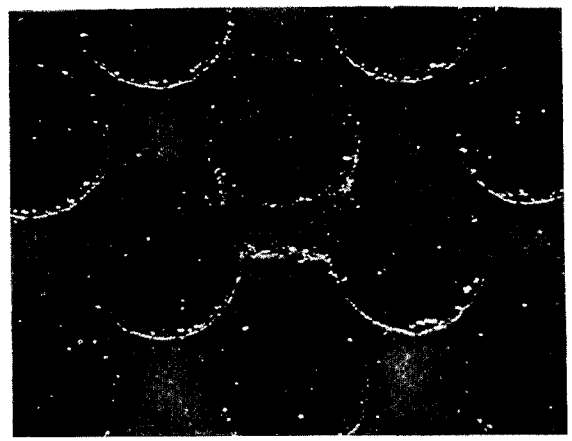
FIGS. 6 and 7 illustrate a metallurgy pattern on a ceramic substrate with extraneous metal areas as it appears before and after the application of the rework process of our invention.
Figure 7:
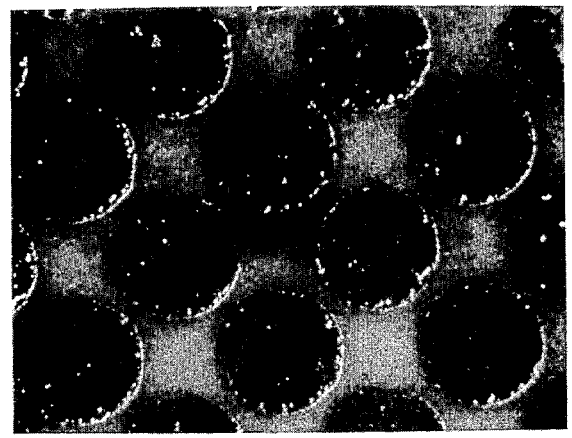
Figure 8:
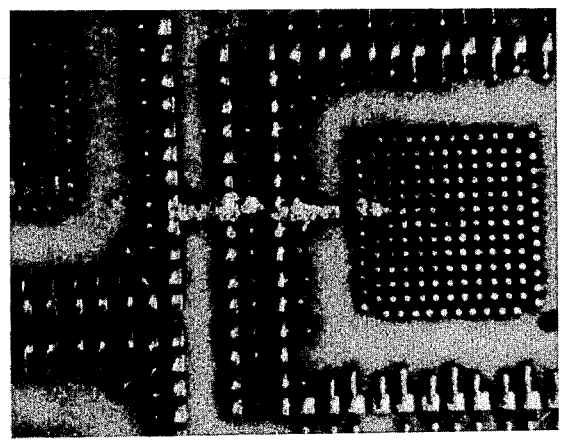
FIGS. 8 and 9 are top plan view of a ceramic substrate with a complex metallurgy pattern with extraneous metal areas illustrating the appearance of the substrate before and after the application of the process of our invention.
Figure 9:
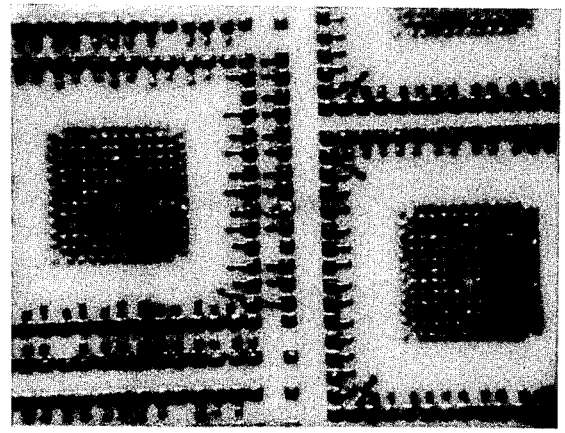

FIGS. 3 and 4 illustrate and explain the criticality of the step of heating the substrate prior to the application of ultrasonic energy to the areas to be removed. When the ceramic substrate with a layer of metal, in particular nickel, overlies a refractory metal pad or area and the substrate is heated, the bond between the refractory metal pad and the overlying nickel layer is strengthened due to diffusion. However, during this same heatup phase, the ceramic imposes a constraint on the thermal expansion of the nickel film which results in a gradually increasing compressive stress in the film with increasing temperature. FIG. 4 illustrates the difference in coefficient of expansions over the various temperature ranges. However, during the cool-down phase, the stress state in the nickel film reverses due to thermal contraction mis-match with the ceramic. When this stress exceeds that need to overcome the adhesion of the film to the ceramic, the nickel film delaminates from the ceramic. While a similar stress buildup would occur in the nickel film overlying the molybdenum features, this stress cannot overcome the strong diffusional bond between the two so that this interface will remain intact.

The selective removal of the non-adhering metal film from the ceramic does not lend itself to a clear theoretical analysis although its effectiveness has been well established. A reasonable explanation of the mechanism involved is illustrated in FIG. 4. The ultrasonic horn provides a localized, intense source of ultrasonic waves at the horn tip. When held close to the substrate surface in a coupling medium such as water, the ultrasonic energy waves 22 incident to the nickel film adhering to the molybdenum features are harmlessly transmitted to the substrate and dissipated. The waves 24 incident on the loose nickel film on the ceramic are mostly absorbed in this film causing the film to vibrate at the frequency of the ultrasonic field about the points of strong adhesion on the neighboring molybdenum features. This rapid vibration eventually causes the film to break off from its points of adhesion due to fatigue, and once freed, is removed from the substrate surface. Although the above explanation assumes a direct coupling of the ultrasonic field to the substrate surface, the mechanism may also involve the production of shock waves by collapsing bubbles under the horn tip in the action of these shock waves on the loosely adhering metal film on the ceramic leading to their removal.

The ease of removal depends on the number of variables, principal among them being (1) the nature of the metal film, (2) the surface texture of the ceramic, (3) interdiffusion conditions, i.e. temperature in the ambient, (4) horn design, (5) horn power, (6) horn-to-substrate spacing, (7) the nature of the coupling fluid, and (8) the temperature of the coupling fluid.

It is often observed in electroless nickel plating that the thickness of the nickel layer in the bridging regions is significantly less than the thickness of the nickel layer deposited on the refractory metal features. This is so because the bridging layer grows from adventitious catalytic points far less numerous than the catalytic points present on the refractory metal features. When the thickness of the bridging nickel film is of the order of the real roughness of the ceramic surface or less, which typically ranges from 1-2 $\mu$m, the bridging film removal by this technique becomes difficult if not altogether impractical. We believe that the reason for this is as follows: the thicker nickel deposits (>2 $\mu$m), the diffusion heat treatment imparts to the nickel film sufficient lateral cohesion to enable the entire film to act in concert to pull away from the ceramic surface under the influence of the differential thermal stress induced during the cooling phase of the heat treatment. In thinner deposits, however, the required degree of cohesion will be lacking and the film will girdle around asperities on the ceramic surface. Under these circumstances, the differential thermal contraction between the nickel and the ceramic only causes them to embrace these asperities even more tightly, making their removal by the action of the ultrasonic horn much more difficult. A similar difficulty does not arise with the stray deposits of the immersion gold because it does not form a continuous layer but only deposits on stray deposits of reduced nickel salts that occasionally seep out of the pores in the nickel coated refractory features.

The process of our invention can be used to remove any electro or electrolessly plated layer having a coefficient of expansion significantly different from the underlying ceramic material. Typically, such metals are nickel, copper, tin, gold, lead and alloys thereof. The metal layer can also be a composite layer. The ceramic is typically alumina, various mixtures of glasses, mullite, and the like. Refractory metals include tungsten, tantalum and molybdenum.

The heating step, prior to application of the sonic energy, can be to any suitable temperature that will achieve the aforedescribed result.

The temperature is dependent on the metal. The lower limit of the useful range is the lowest temperature that produces a diffusion bond between the overlying metal and the refractory metal. The upper range is usually determined by what temperature will cause degradation of the metals and associated elements on the substrate. For a nickel layer overlying a refractory metal the range is from 600° to 1000° C., more preferably from 700° to 900° C. For a gold layer the heating temperature is greater than 400°, more preferably from 400° to 700° C., most preferably from 550° to 600° C. The duration of the heating step is dependent on the various conditions such as the type of ceramic and its surface texture, the nature and thickness of the metal to be removed, temperature, etc. Typically the time will vary from 1 to 10 minutes, although the heating can be prolonged, if desired. Again an important consideration is preventing degradation of the layers with excessively high temperatures. The frequency of the ultrasonic energy is ordinarily in the range of 10 to 20 KHZ, preferably of the order of 20 KHZ. The time of exposure will also depend on various conditions such as the nature and thickness of the metal film, the thickness of the coupling medium, temperature, etc. Excessive times of exposure to the action of ultrasonic horn is to be avoided as it might damage the integrity of the refractory metal-to-ceramic bond. The coupling medium is most preferably water and at or about room temperature. However, any other suitable fluid can be used at whatever temperature the removal process works well.

The general requirement of the coupling medium is that it is a fluid with high cavitation efficiency, i.e. a liquid having a low vapor pressure. Other suitable coupling mediums include various oils and hydrocarbons. Water is the most preferred because its use does not require cleaning procedures after usage.

The ultrasonic energy is applied by placing an ultrasonic horn in close proximity to the metal areas to be removed. The horn should be placed as close as possible, without contacting the substrate, but preferably not exceeding 0.075 cm. The strength of the ultrasonic energy can be measured by the power supplied to power supply. The power is normally in the range of 150 to 600 watts/cm$^2$. The time of application will vary. In general the time will not normally exceed 10 minutes.

EXAMPLE

A multilayer substrate having an array of closely spaced molybdenum circuit features on its surface had formed an unwanted bridging nickel layer connecting these features at several locations. The thickness of the electroless nickel layer was about 6.5 $\mu$m on the refractory metal features and about 4 $\mu$m in the bridged regions on the ceramic surface. After a diffusion heat treatment at about 850° C. the bridging nickel layer was removed by subjecting this region of the substrate to the action of an ultrasonic horn held at a distance of about 0.025 cm from its surface while immersed in water. The horn used was rated at a power level of 300 watts/cm$^2$ and the removal time was approximately 2 minutes.

Another substrate with a bridging nickel thickness of approximately 1 $\mu$m was subject to the ultrasonic horn action after a similar diffusion treatment. Under similar conditions of horn power and position as described previously, the bridged metal layer could not be removed even after a 30 minute exposure. The attempt to remove the bridging was stopped because of the commencement of cavitation damage to the substrate.

We claim:

1. A re-work process for selectively removing extraneous plated metal layer areas of a metal selected from the group consisting of Ni, Au, Cu and alloys thereof, from the surface of a defective ceramic substrate containing refractroy metal surface areas of a metal selected from the group consisting of W, Ta, Mo, and mixtures thereof, capable of making electrical contact with semiconductor devices mounted on the top surface of the substrate comprising,
    heating the substrate at a temperature for a time sufficient to strengthen the interface bond between the plated metal layer and the refractory metal areas while reducing the interface bond between the extraneous plated metal layer areas overlying the ceramic, and the ceramic substrate,
    cooling the substrate
    immersing the resultant heated-treated substrate in a liquid,
    applying localized ultrasonic energy in close proximity to the extraneous plated metal areas to be removed until the metal areas are separated from the substrate but leaving the plated metal areas overlying said refractory metal areas.

2. The process of claim 1 wherein said extraneous plated metal layer is nickel, and the substrate is heated to a temperature in the range of 600° to 1000° C.

3. The process of claim 2 wherein said plated metal layer is deposited by electroless plating.

4. The process of claim 1 wherein said extraneous plated metal layer is gold, and the substrate is heated to a temperature in the range of 400° to 700° C.

5. The process of claim 4 wherein said plated metal layer is deposited by electroless plating.

6. The process of claim 1 wherein said substrate is immersed in water.

7. The process of claim 6 wherein said localized ultrasonic energy is applied to said extraneous plated layer areas with an ultrasonic horn immersed in the liquid, which ultrasonic horn is spaced from said substrate a distance not greater than 0.075 cm.

8. The process of claim 1 wherein said localized ultrasonic energy is applied to said extraneous plated metal layer areas with an ultrasonic horn immersed in the liquid, which horn is spaced from said substrate a distance in the range of 0.025 to 0.075 cm.

9. The process of claim 8 wherein the power input to said ultrasonic horn is in the range of 150 to 600 watts/cm$^2$.

10. The process of claim 9 wherein the duration of the application of ultrasonic energy to each individual extraneous plated metal area is not greater than 10 minutes.

11. The process of claim 10 wherein said duration of the application of ultrasonic energy to each individual extraneous metal plated area is in the range of 2 to 5 minutes.

* * * * *